United States Patent [19]

Adler et al.

[11] 4,088,927
[45] May 9, 1978

[54] INTERFERENCE-PROTECTED, SWITCH-CONTROLLED SQUARE WAVE GENERATION CIRCUIT

[75] Inventors: Karl-Heinz Adler, Leonberg; Ulrich Drews, Vaihingen-Pulverdingen; Peter Werner; Heinz Möller, both of Stuttgart; Heinz Kammerer, Nellingen, all of Germany

[73] Assignee: Robert Bosch GmbH, Stuttgart, Germany

[21] Appl. No.: 744,789

[22] Filed: Nov. 24, 1976

[30] Foreign Application Priority Data

Dec. 23, 1975 Germany .............................. 2558114

[51] Int. Cl.² .............................................. F02P 3/06
[52] U.S. Cl. ............................. 315/209 T; 123/148 E; 307/247 A; 307/359; 307/237
[58] Field of Search ................... 307/237, 247 A, 289, 307/291, 215, 359; 315/209 T; 123/148 E, 148 CA, 148 CB

[56] References Cited

U.S. PATENT DOCUMENTS

| 3,434,463 | 3/1969 | Bartch | 315/209 T |
| 3,716,728 | 2/1973 | Hachenburg | 307/289 X |
| 3,854,466 | 12/1974 | Steinberg et al. | 123/148 E |
| 3,925,682 | 12/1975 | Hamada | 307/247 A |
| 3,978,838 | 9/1976 | Oister | 123/148 CA |
| 4,015,145 | 3/1977 | Stewart | 307/247 A |

Primary Examiner—John S. Heyman
Attorney, Agent, or Firm—Flynn & Frishauf

[57] ABSTRACT

To provide an undistorted square wave output signal under control of a switch subject to contact chatter so that the square wave will accurately reflect the operating instant of the switch, as commanded, regardless of contact chatter, a timing circuit is provided having a timing capacitor and a charge and discharge circuit therefor, connected to a threshold circuit, the threshold circuit response level and the charge circuit of the timing capacitor being dimensioned to cause the capacitor to charge to a level such that the threshold circuit responds only when the switch has changed state, typically closed after interrupting an inductive load, such as the primary of a spark plug, for a predetermined time period as determined by the switch contact chatter characteristics of the switch itself, for example about 0.6 to 1 millisecond in the case of automotive ignition breaker switches; a feedback connection is provided between the threshold circuit and the input stage to the circuit to disable transfer of a signal representative of change of the switch through the circuit unless the threshold level of the threshold circuit has been exceeded so that the threshold circuit could respond.

8 Claims, 3 Drawing Figures

INTERFERENCE-PROTECTED, SWITCH-CONTROLLED SQUARE WAVE GENERATION CIRCUIT

The present invention relates to a circuit arrangement to obtain an undistorted, interference-protected square wave control signal, and more particularly to derive such a square wave control signal from a cam-controlled ignition breaker switch connected in series with the primary circuit of an automotive ignition coil associated with the ignition of an internal combustion engine.

The circuit of the present invention is particularly useful to derive a controlled square wave signal representative of opening and closing of the ignition breaker switch as a control signal representative of speed of the engine for use in fuel injection systems.

Fuel injection systems have been proposed in which a sensing capacitor is charged during the time that the crankshaft of the engine passes through a predetermined angle thereof. The charge current is a constant predetermined current. The charge voltage which the capacitor will reach will be inversely proportional to the speed of the engine and, upon subsequent discharge of the capacitor to a predetermined value, is one parameter which determines the quantity of fuel to be injected by a subsequently connected fuel injection valve, since the open-time of the valve will be determined, in part, by the charge on the capacitor. Such fuel injection systems can simply derive speed signals by determining the initiation and the end of charging of the capacitor by an electrical switch controlled by the cam shaft of the internal combustion engine. Square wave signals can be used and such square wave signals can, suitably, be derived from the primary winding of the ignition coil or, respectively, the breaker terminal of the ignition system. The control signals derived from the ignition coil are, however, subject to superposed a-c swings and oscillations which occur upon opening of the breaker switch. Multi-cylinder engines, particularly engines having a large number of cylinders and operating at high speeds, are subject to additional noise signals which occur due to chatter of the breaker contacts. The ideal square wave signal to be derived from a switch is, therefore, substantially distorted by oscillations and other undesired noise signals which substantially interfere with the generation of a square wave signal which is unambiguously associated with the engine operating cycles, and hence with engine speed.

It is an object of the present invention to provide a system and a circuit to derive a square wave signal from the ignition circuit and system of an internal combustion engine and in which the duration of the square wave is immune to interference resulting from operation of the engine, and particularly to the above referred-to phenomena, and in which the square wave is inversely proportional to the time which is associated with a predetermined angular rotation of the crankshaft, for example 180°, without being influenced by the above referred-to difficulties, or subject thereto.

Subject matter of the present invention: Briefly, an input stage is provided to which a timing circuit is connected having a timing capacitor and a charge and discharge circuit therefor. A threshold circuit is coupled to the timing capacitor, the response level of the threshold circuit and the charge circuit of the timing capacitor being dimensioned to cause the capacitor to charge to a level at which the threshold circuit responds only when the switch, typically the breaker terminals in series with an ignition coil of an automotive engine have changed state for an uninterrupted period of time which is longer than expected interferences, in the case of automotive breaker terminals about 0.6 to 1.0 millisecond; a feedback circuit is connected between the threshold circuit and the input stage and disabling transfer of signals representative of change of state of the switch through the circuit unless the threshold level of the threshold circuit has been exceeded so that the circuit has responded, indicating that the switch, positively and finally, has changed state, for example has again closed after having opened to interrupt the current flow through the primary of the ignition coil.

The invention will be described by way of example with reference to the accompanying drawings, wherein.

Figure 1:
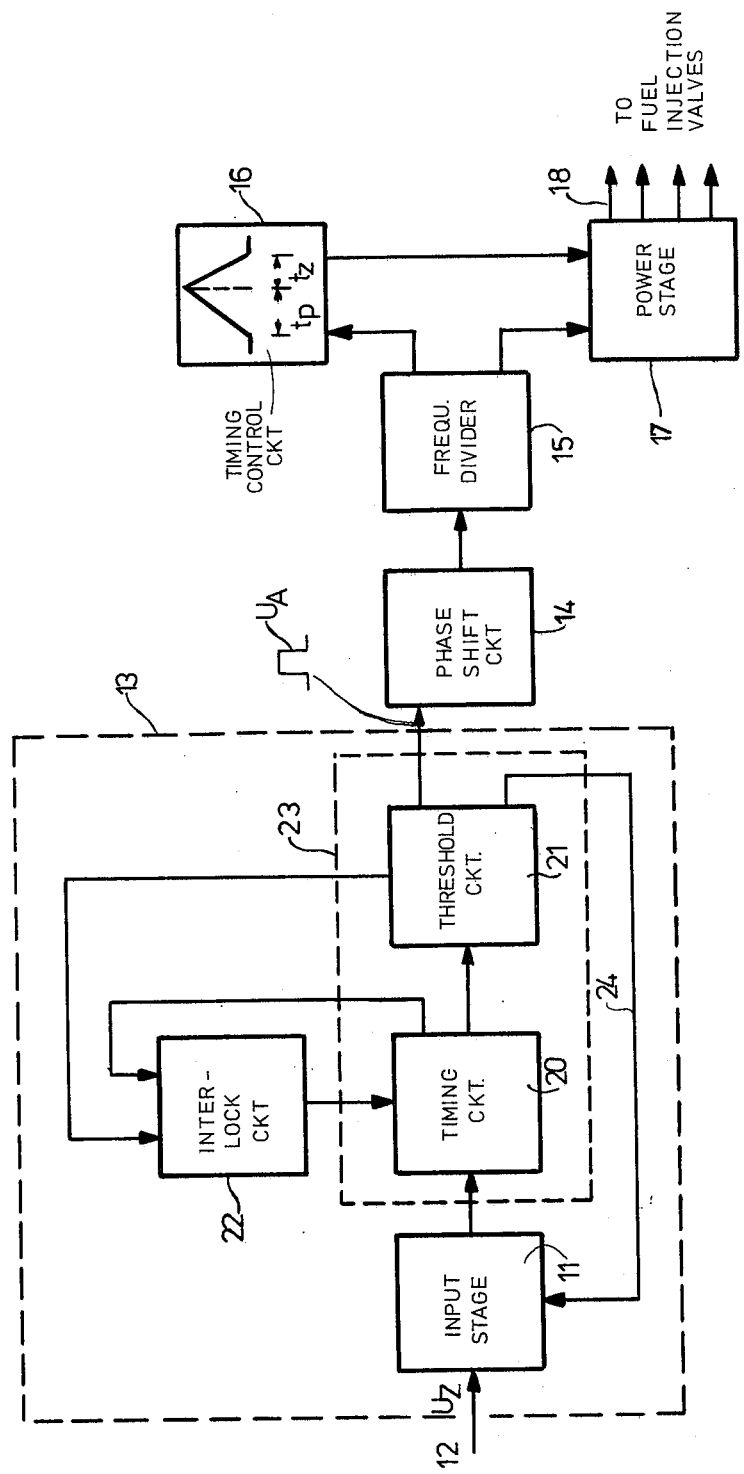
FIG. 1 is a basic schematic block diagram of the circuit arrangement in accordance with the present invention.
Figure 2:
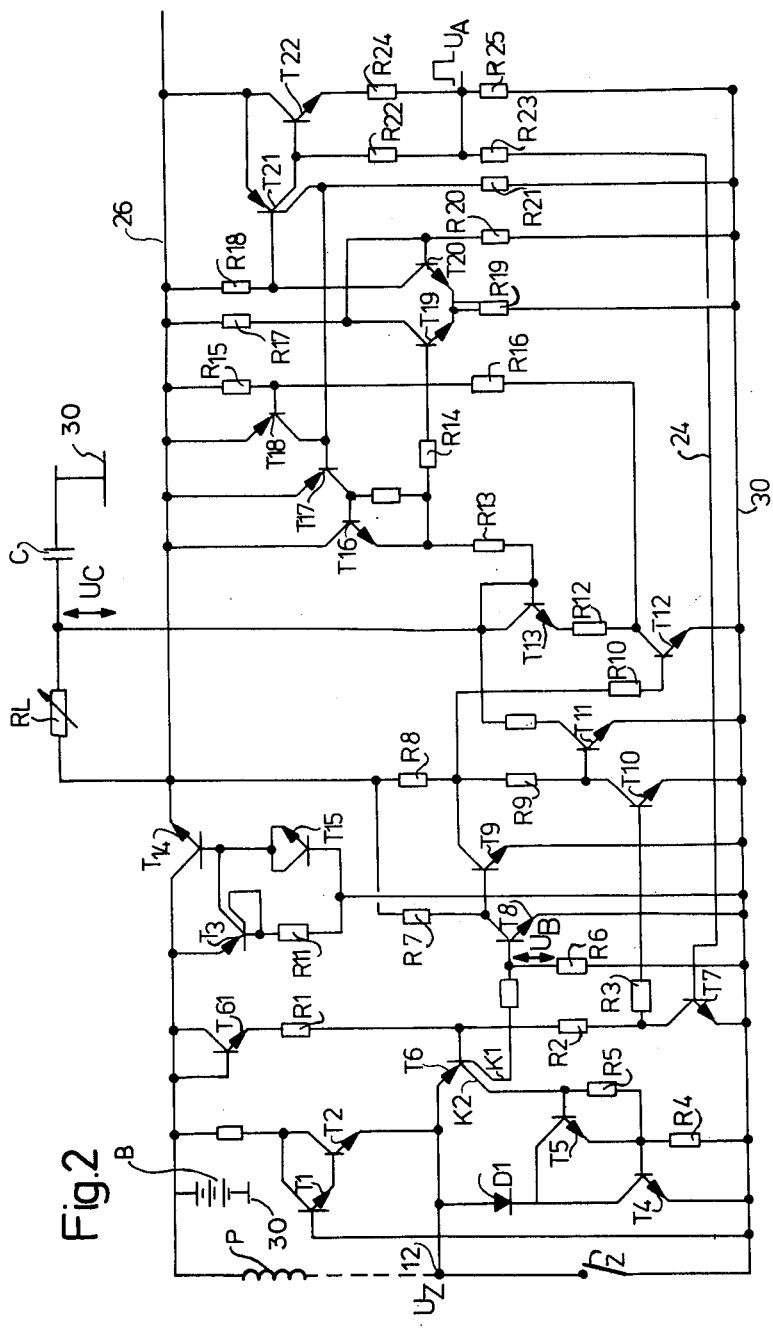
FIG. 2 is a detailed circuit diagram of the circuit shown in FIG. 1.

The circuit (FIG. 1) has an input stage 11 which, as best seen in FIG. 2, is connected to the junction point 12 between the primary P of an ignition coil and the ignition breaker terminals Z of an automotive ignition system of an internal combustion engine (not shown). The circuit arrangement will be explained in connection with a fuel injection system in which a square wave signal is derived representative of engine speed.

The input stage 11 is part of a wave-shaping stage 13, the output of which provides interference-free square wave signals $U_4$. These signals are connected to a phase shift circuit 14 which, in turn, is connected to a frequency divider 15. The frequency divider includes one or more timing circuits, for example bistable multivibrators, which provide square wave signals having a frequency which is representative of speed of the engine crankshaft by suitable choice of the frequency division ratio. A timing control circuit 16 is connected to the output of the frequency divider 15; this timing control circuit, preferably, is a multivibrator which includes a sensing capacitor charged from a constant current charging source, not shown. The constant current is applied to charge the capacitor during the time $t_p$ of the control pulses derived by the frequency divider 15. The charge voltage accumulated on the capacitor thus will have a value which is high when the engine operates slowly, since the duration $t_p$ is representative of a predetermined portion of engine crankshaft rotation and thus will be longer when the engine operates at a slower speed. When the control pulse terminates, a power stage 17 connected over four distribution lines 18 to four electromagnetically operated injection valves, not shown, is enabled. The enabling duration $T_z$ will be determined by charge on the capacitor in timing control circuit 16 dropping to a predetermined minimum value when the capacitor is discharged by a discharge current which can be controlled to be representative of additional engine operating parameters, for example the quantity of air being sucked in by the internal combustion engine.

The charge time $t_p$ to charge the capacitor in the timing control circuit 16 must be accurate and must not be influenced by interference signals derived from the ignition system due to interfering oscillations, contact chatter, or the like.

In accordance with the invention, the square wave generating circuit 13, operating essentially as a wave-shaping circuit, includes a timing circuit 20 and a threshold circuit 21 which, together, form a monostable circuit 23. An interlock circuit 22 has its inputs connected both to the timing circuit 20 as well as to the threshold circuit 21 and has its output connected to the timing circuit 20. A feedback circuit or feedback connection 24 is provided between threshold circuit 21 and the input stage 11.

The entire square wave generating circuit 13 can be constructed by monolithic integrated circuit technology.

Referring to FIG. 2:

Junction 12, connected between the primary P of an ignition coil (not shown) and switch Z is connected to input stage 11 which includes a protective circuit formed by transistors T1, T2, T4, T5 and diode D1, and an amplifier formed by transistors T6, T8 and T9. The feedback line 24 is connected by way of transistor T7 with emitter resistors R24, R25 through coupling resistor R23 to the output transistor T22 associated with the threshold switch. The base of the input transistor T6 of the amplifier is connected to a voltage divider formed by resistors R1, R2, R3 and the base-emitter path of transistor T10. Transistor T7 is connected between the junction of resistors R2 and R3 and the common ground or chassis bus 30; upon conduction of transistor T7, the switching level of the amplifier can be so changed that oscillations in the vicinity of its switching point are avoided.

The input stage must respond reliably when the input voltage has reached only 6 V; this is the case, if, e.g., switching transistors of the transistorized ignition system are connected to the breaker contact Z. Upon opening of the contact Z, however, interrupting primary voltage through the coil P, the voltage may reach an instantaneous value of up to 600 V. Transistor T6 could not switch the current which arises at such high input voltages; this current may reach about 60 mA under such conditions. The permitted collector-emitter voltages additionally must not be exceeded. To this end, transistor T6 is formed as a double-collector transistor, having two collectors K1 and K2. The additional collector K2 controls transistors T5 and T4 to thereby draw off or bypass so much current that the junction point 12 is clamped and transistor T8 will not reach an undesired or dangerous current level at its base. The area of the first collector K1 of the transistor T6 is about five times larger than the area of the second collector K2 of the transistor T6. Thus, five-sixths of the collector current of transistor T6 are available to control transistor T8 and only one-sixth is used to control transistors T5 and T4. The current bypass or shunt path formed by the transistors T5 and T4 is effective only at the high input voltage peaks above referred to, thus resulting in high sensitivity of the circuit and in reliable low-voltage response.

Negative voltages at the junction point 12 are by-passed by the transistors T1 and T2 which then become conductive. As a result, junction 12 is maintained at a voltage which is, at the most, two diode voltages below the voltage of the ground or chassis bus 30. The power supply for the system is illustrated, schematically, by battery B which may be the vehicle battery. The ignition switch and other standard or non-essential elements have been omitted.

Figure 3:
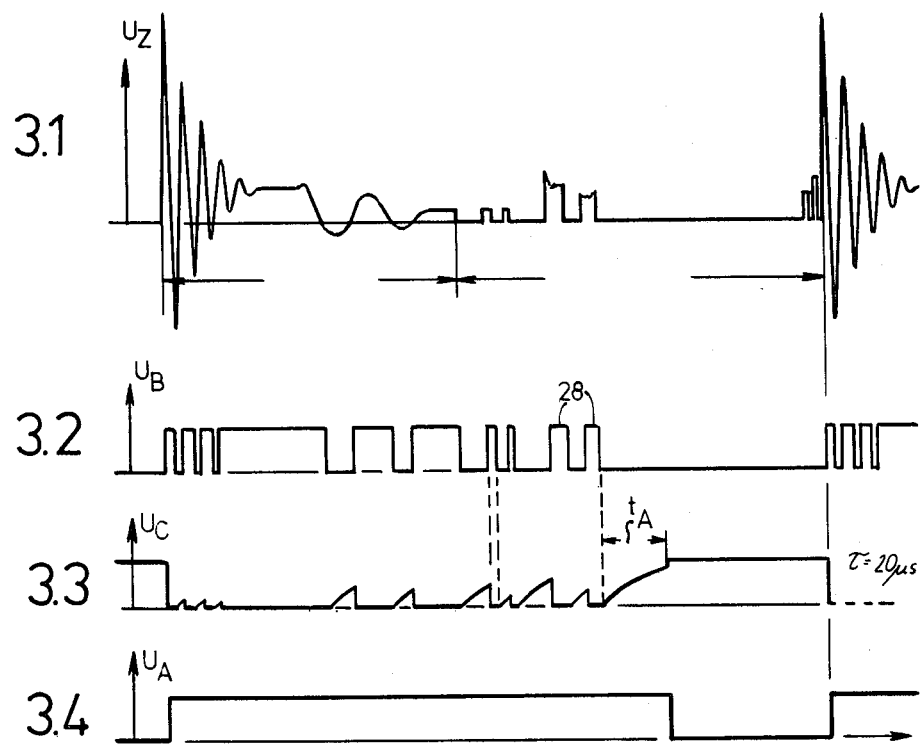
FIG. 3 is a series of timing diagrams illustrating voltages arising in the circuit of FIG. 2.

Operation, with reference to FIG. 3, and particularly operation of delay stage 20 and threshold switch 21:

Graph 3.1 illustrates the voltage $U_Z$ across switch Z, and arising at terminal 12. Graph 3.2 of FIG. 3 illustrates the voltage $U_B$ at the base of transistor T8; graph 3.3 illustrates the voltage across capacitor C (FIG. 2), and graph 3.4 illustrates the output voltage $U_A$.

In quiescent state, and while passing current through the primary P, breaker contact Z is closed. Consequently, and as will appear, output transistor T 22 is blocked. The voltage $U_B$, as shown in graph 3.2 of FIG. 3, is zero. Transistor T11 is held in blocked or non-conductive state by short circuiting its base, by the transistor T10, which is rendered conductive by base current through resistors R3, R1 and R2. This blocks the output transistor T22 of the wave-generating circuit 13. It also places the base of transistor T7, over resistors R23 and R25 to chassis bus 30, causing it to block. The electrode connected through the charge resistor RL of capacitor C will be charged, since the charge resistor RL which, preferably, is variable, is connected to the positive bus 26 connected to the battery B (see graph 3.3, FIG. 3). The positive bus 26 is voltage-stabilized by a voltage regulating or stabilizing circuit formed by transistors T3, T14 and T15 in a circuit which is known. The input transistor T19 of the threshold switch is conductive and holds transistor 20 in blocked state; it also holds the two output transistors T21, T22 in blocked state.

When the voltage $U_Z$ at junction 12 reaches a positive value, transistors T6 and T8 cause transistor T9 to block, so that transistor T12 (FIG. 2) will become conductive. The capacitor C, previously charged (graph 3.3 of FIG. 3) discharges over transistor T13, resistor R12 and transistor T12 with a time constant $\tau = 20$ microseconds. As the capacitor discharges, a threshold or trigger level of threshold switch 21 is passed. This threshold level is determined by the resistors R17, R19 of the threshold switch 21, connected to transistor T19. A further transistor T20 forms part of the threshold switch, resistor R19 being a common emitter resistor for both transistors T19, T20. The threshold switch 21 will change state, that is, will flip over as soon as the threshold level determined by resistors R17, R19 is passed, causing transistors T20 to become conductive which, in turn, causes transistors T21 and T22 to become conductive. The feedback line 24 will have current applied thereto which causes transistor T7 to become conductive, causing transistor T10 to black and transistor T11 to become conductive since base current is now available over resistors R8, R9. A second discharge circuit is thus effectively placed in parallel with transistors T13 and T12. This second discharge circuit is of lower resistance and has a time constant $\tau_2 = 1$ microsecond. This fast and rapid discharge circuit is effective from its triggering instant for the duration of the unstable time formed by the delay or timing circuit and the threshold circuit 21, together forming a monostable timing circuit, 23.

When, upon closing of the breaker contact Z, the voltage $U_Z$ and hence the voltage $U_B$ drops below 2 V, transistor T9 becomes conductive and the two discharge transistors T11, T12 both will block. This permits charge capacitor C to re-charge over charge resistor RL until its voltage $U_C$, after a charge period $t_A$ of about 0.8 ms has reached the threshold level determined by resistors R17 and R19, which again causes the previously blocked transistor T19 to become conductive.

The time $t_A$ of 0.8 milliseconds is the timing limit of the timing circuit, in this case the unstable time of the monostable circuit. During this time, short positive pulses as illustrated at 28 in graph 3.2 of FIG. 3 due, for example, to contact chatter of the contact Z may occur. These pulses which are longer than 4 microseconds may cause transistors T11 and T12 to become conductive for short periods of time, causing discharge of the capacitor C during the time of 4 microseconds. Thus, a monostable timing interval is reinitiated with each chatter pulse 28. As a result, the threshold switch 21 will change state or flip over only if the breaker contact Z has been closed for an uninterrupted period of at least 0.8 ms. Short-time contact chatter pulses thus cannot influence the output pulse $U_A$.

The circuit includes an interlock stage 22. This interlock stage is provided to eliminate the effect of voltage collapse or voltage dips from the battery B to supply the circuit arrangement, if the voltage is at least above the voltage maintained by the stabilizing stage formed by transistors T3, T14, T15. It may occur, however, that the voltage drops below the stabilized voltage value and then the possibility occurs that the voltage divider formed by resistors R17-R19 provides a trigger threshold which oscillates about the fixed voltage of the capacitor C and may lead to an erroneous output pulse.

To prevent generation of erroneous pulses, the input of the threshold switch is placed over transistor T16 and transistor T17 which, in turn, is connected to transistor T21 over a low-resistance connection to the stabilized voltage of positive bus 26 as soon as the time $t_A$, that is, the monostable time interval, has elapsed. Simultaneously, capacitor C is rapidly charged to the stabilized voltage. This rapid charge provides additional rapid resetting of the circuit to permit recycling thereof. The interlock is eliminated by the normal or ordinary input pulses. Upon generation of a positive pulse at junction 12, transistor T12 will become conductive. Conduction of transistor T12 controls transistor T18 to be conductive which blocks transistors T16 and T17, thus eliminating the interlock.

The output $U_A$ of the circuit 13 available at the emitter of the output transistor T22 provides square wave pulses $U_A$ which are synchronous with ignition events and are free from superposed or other noise or oscillation pulses. They are suitable to provide an undistorted output signal representative of speed of the internal combustion engine, derived directly from the ignition circuit, and can be used to provide signals extending over a predetermined angle of the crankshaft of the engine to control operation of the engine which depends on such rotation.

Various changes and modifications may be made within the scope of the inventive concept.

We claim:

1. Interference-protected, switch-controlled square wave generation circuit (13) to provide an undistorted square wave output signal under control of a switch (Z) comprising
   an input stage (11) selectively having power applied thereto under control of the switch (2);
   a timing circuit (20) connected to the input stage and having a timing capacitor (C)
   a charge circuit for said timing capacitor including
   a voltage stabilized source (B, T3, T14, T15, 26) and a charge resistor (RL), the capacitor (C) being continuously connected through the charge resistor (RL) to the voltage stabilized source;
   a discharge circuit (T12, R12, T13) for said timing capacitor (C) including a controlled switch means (T11, T12);
   a threshold circuit (21) coupled to the timing capacitor (C) including
   a threshold sensing transistor (T19) having its base connected to the discharge circuit of the capacitor (C) and;
   a second threshold transistor (T20), said sensing transistor (T19) and the second threshold transistor (T20) having a common emitter resistor (R19),
   the threshold response level of the threshold circuit (21) and the charge circuit of the timing capacitor (C) being dimensioned to cause the capacitor to charge to a level at which the threshold circuit responds only when the switch (Z) has changed state for an uninterrupted period of time of about at least 0.6 milliseconds and during which interfering or noise pulses have ceased and arising at said switch;
   a feedback connection (24) between the threshold circuit (21) and the input stage and disabling transfer of a signal representative of change of state of the switch unless the threshold level of the threshold circuit has been exceeded so that the threshold circuit has responded an output transistor (T21, T22) having its base controlled by one of the threshold transistors (T20);
   an interlock circuit (22) including
   a blocking circuit connected to and controlled by the output transistor (T21) and having its output connected to the threshold circuit (21) to modify the threshold response level thereof,
   and a control transistor (T7) forming part of the input stage (11) and controlled by said feedback connection (24), said control transistor (T7) controlling one of the transistors (T11) of the controlled switch means of the discharge circuit.

2. Circuit according to claim 1, wherein the controlled switch means comprises at least one transistor (T11, T12);
   and at least one coupling resistor (R13, R14) is provided connecting the collector of said at least one transistor (T11, T12) to the sensing transistor (T19).

3. Interference-protected square wave generation system to derive a square wave representative of ideal operating time on an ignition breaker contact switch independent of switch chatter and interfering noise signals comprising
   the circuit of claim 1
   and wherein the switch is the breaker contact, and an ignition coil is provided having a primary winding (P) connected in series with the switch (Z),
   the output square wave ($U_A$) having an operating time occurring upon initial opening of the switch (Z) and continuing regardless of switch chatter until the switch has re-closed and remained re-closed for a predetermined duration.

4. System according to claim 3, wherein the input stage (11) includes a dual collector transistor (T6) in which the collectors have different collector areas to effect response of the input stage regardless of inductive over-voltages arising upon opening of the breaker switch (Z).

5. System according to claim 4, wherein the blocking circuit includes a transistor (T17) connected to and controlled by the threshold circuit (21) and controlling the feedback connection (24) to effect blocking of transfer of signals from the input stage (11) through the circuit unless the breaker switch (Z) has remained open uninterruptedly for a period of between 0.6 milliseconds to 1 millisecond.

6. System according to claim 1, wherein the input stage (11) includes a dual collector transistor (T6) in which the collectors have different collector areas to effect response of the input stage regardless of inductive over-voltages arising upon opening of the breaker switch (Z).

7. System according to claim 6, wherein the blocking circuit includes a transistor (T17) connected to and controlled by the threshold circuit (21) and controlling the feedback connection (24) to effect blocking of transfer of signals from the input stage (11) through the circuit unless the breaker switch (Z) has remained open uninterruptedly for a period of between 0.6 millisecond to 1 millisecond.

8. System according to claim 1, wherein the blocking circuit includes a transistor (T17) connected to and controlled by the threshold circuit (21) and controlling the feedback connection (24) to effect blocking of transfer of signals from the input stage (11) through the circuit unless the breaker switch (Z) has remained open uninterruptedly for a period of between 0.6 millisecond to 1 millisecond.

* * * * *